United States Patent [19]

Schlosser

[11] Patent Number: 5,516,624
[45] Date of Patent: May 14, 1996

[54] PHOTOPOLYMERIZABLE ELASTOMERIC MIXTURE AND RECORDING MATERIAL CONTAINING THIS MIXTURE, FOR PRODUCING OZONE-RESISTANT FLEXOGRAPHIC PRINTING FORMS

[75] Inventor: Hans-Joachim Schlosser, Wiesbaden, Germany

[73] Assignee: E. I. du Ponte de Nemours and Company, Wilmington, Del.

[21] Appl. No.: 460,685

[22] Filed: Jun. 2, 1995

Related U.S. Application Data

[62] Division of Ser. No. 323,167, Oct. 13, 1994, which is a continuation of Ser. No. 407,614, Apr. 16, 1993, abandoned, which is a continuation of Ser. No. 450,077, Dec. 13, 1989, abandoned.

[30] Foreign Application Priority Data

Dec. 13, 1988 [DE] Germany ............... 38 41 853.3

[51] Int. Cl.$^6$ ............... G03F 7/30; G03F 7/40
[52] U.S. Cl. ............... 430/306; 430/309
[58] Field of Search ............... 430/306, 309

[56] References Cited

U.S. PATENT DOCUMENTS

| | | | |
|---|---|---|---|
| 3,322,904 | 7/1967 | Combe et al. | 260/33.2 |
| 4,065,430 | 12/1977 | Satomura | 260/47 |
| 4,162,919 | 7/1979 | Richter et al. | 96/87 |
| 4,177,074 | 12/1979 | Proskow | 522/121 X |
| 4,253,879 | 3/1981 | Hammer et al. | 106/165 |
| 4,272,608 | 6/1981 | Proskow | 522/121 X |
| 4,320,188 | 3/1982 | Heinz et al. | 430/281 |
| 4,369,246 | 1/1983 | Chen et al. | 430/306 |
| 4,379,190 | 4/1983 | Schenck | 428/95 |
| 4,400,460 | 8/1983 | Fickes et al. | 522/79 X |
| 4,423,135 | 12/1983 | Chen et al. | 430/271 |
| 4,428,854 | 1/1984 | Enjo et al. | 252/69 |
| 4,430,468 | 2/1984 | Schumacher | 524/109 |
| 4,452,879 | 6/1984 | Fickes et al. | 430/286 X |
| 4,454,052 | 6/1984 | Shoji et al. | 252/68 |
| 4,680,251 | 7/1987 | Schober | 430/306 |
| 5,075,192 | 12/1991 | Fryd et al. | 430/138 |
| 5,254,280 | 10/1993 | Taoshira et al. | 252/68 |
| 5,270,399 | 12/1993 | Czornij et al. | 525/327 |
| 5,328,942 | 7/1994 | Akhtar et al. | 524/35 |
| 5,349,097 | 9/1994 | Thome et al. | 568/906 |
| 5,378,762 | 1/1995 | Czornij et al. | 525/187 |

FOREIGN PATENT DOCUMENTS

| | | |
|---|---|---|
| 1358062 | 6/1974 | United Kingdom . |
| 1395822 | 5/1975 | United Kingdom . |
| 1577706 | 10/1980 | United Kingdom . |
| WO88/02135 | 3/1988 | WIPO . |

OTHER PUBLICATIONS

Merck Index–p. 1204.
Grant et al, "Calender", *Grant & Hackh's Chemical Dictionarys* 5th ed., McGraw–Hill Book Company, New York, N.Y. 1987, p. 107.

Primary Examiner—Cynthia Hamilton

[57] ABSTRACT

A photopolymerizable elastomeric mixture for producing ozone-resistant flexographic printing forms is disclosed which contains an elastomeric binder, an olefinically unsaturated compound polymerizable by free radicals, a photoinitiator, and a polyglycol ether of the general formula I

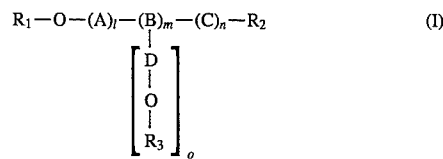

in which $R_1$ and $R_2$ are alkyl, especially $(C_1-C_3)$-alkyl, $R_3$ is hydrogen or alkyl, especially $(C_1-C_3)$-alkyl, A, B, C and D can be identical or different and are oxa-n- or -iso-alkylene, especially oxa-n- or -iso-$(C_1-C_5)$-alkylene and l+m+n+o is 3 to 40.

A recording material containing the photopolymerizable mixture as well as a process for producing a flexographic printing form are likewise described. The flexographic printing form obtained shows improved ozone resistance as compared with forms of the state of the art.

5 Claims, No Drawings

PHOTOPOLYMERIZABLE ELASTOMERIC MIXTURE AND RECORDING MATERIAL CONTAINING THIS MIXTURE, FOR PRODUCING OZONE-RESISTANT FLEXOGRAPHIC PRINTING FORMS

This is a division of application Ser. No. 08/323,167, filed Oct. 13, 1994, now allowed, which was a continuation of Ser. No. 08/407,614 filed Apr. 16, 1993, since abandoned, which was a continuation of Ser. No. 07/450,077 filed Dec. 13, 1989, since abandoned.

BACKGROUND OF THE INVENTION

The present invention relates to a photopolymerizable elastomeric mixture for producing ozone-resistant flexographic printing forms, containing an elastomeric binder, an olefinically unsaturated compound polymerizable by free radicals, and a photoinitiator.

Elastomers, in particular those based on butadiene or isoprene, have been known for a long time for production of flexographic printing forms and are described, for example, in DE-B 2,215,090 (=U.S. Pat. No. 4,423,135), DE-A 2,138,582 (=GB-A 1,358,062), 2,223,808 (=GB-A 1,395,822), DE-B 2,815,678 (=GB-A 1,577,706), DE-A 2,456,439 (= U.S. Pat. No. 4,162,919) and 2,942,183 (=U.S. Pat. No. 4,320,188). It was found, however, that flexographic printing forms containing these elastomers become brittle with even the slightest presence of ozone and show cracks.

Ozone, which represents a risk to these plates, is formed both during imagewise exposure of the photopolymerizable elastomeric layer, especially if UV light is used, and during use of the exposed and developed printing forms. In the latter case, particularly high ozone concentrations arise, especially when flexible packaging materials such as paper or plastics are to be printed. This is because, in order to ensure sufficiently strong adhesion of the printing ink, for example, to the plastic films, the latter are corona-treated before printing. Since considerable quantities of ozone are formed during the corona treatment and the treatment is most efficient when it takes place immediately before the printing step, the printing form is contacted with a considerable amount of ozone resulting from this process. The susceptibility of the developed printing form to ozone is further increased by the fact that a post-treatment of the printing forms with halogen, in particular with bromine, is carried out in most cases, in order to reduce their tackiness.

To improve the resistance of the printing form to ozone which forms cracks and promotes brittleness, various approaches have been followed.

According to DE-A 2,215,090, ozone resistance can be improved by additions to the photopolymerizable mixture. Microcrystalline wax and paraffin wax, dibutylthiourea, 1,1,3,3-tetramethylthiourea, norbornene, N-phenyl-2-naphthylamine, unsaturated vegetable oils, ethylene/vinyl acetate copolymers, polyurethanes, chlorinated and/or chlorosulfonated polyethylenes, chlorinated ethylene/methacrylic acid copolymers, polypentadienes, furfural-derived resins, ethylene/propylidene rubbers, diethylene glycol esters of resins and copolymers of α-methylstyrene with vinyltoluene are proposed as additives.

The disadvantage of this method is that the additives are frequently inadequate to ensure the required resistance to ozone or, if the effective concentration of these additives is increased, the photopolymerizable mixture shows such cloudiness that satisfactory imaging is no longer feasible.

Another method for protecting a flexographic printing form from ozone is described in DE-A 3,512,632 (=U.S. Pat. No. 4,680,251). This method is not based on any additions to the photopolymerizable mixture, but describes a post-treatment of the printing form, which has been developed and treated with halogen, with certain polyglycol compounds. The polyglycol compounds described are either not etherified or only mono-etherified.

A major disadvantage of this method is the required additional treatment step. Also, the treatment reagents described leave much to be desired with respect to the achievable ozone resistance.

SUMMARY OF THE INVENTION

It is therefore an object of the present invention to provide a photopolymerizable mixture especially suited for production of flexographic printing forms, having improved ozone resistance and, at the same time, requiring no additional treatment step. The ozone resistance achieved should not have an adverse effect on the image quality.

These and other objects according to the invention are achieved by a photopolymerizable elastomeric mixture for producing an ozone-resistant flexographic printing form, comprising an elastomeric binder; an olefinically unsaturated compound polymerizable by free radicals; and a photoinitiator;

wherein the mixture comprises at least one polyglycol ether of the general formula I

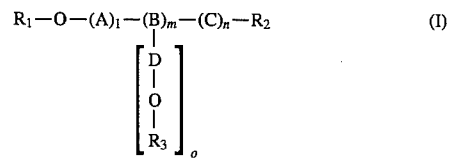

in which $R_1$ and $R_2$ are alkyl, especially $(C_1-C_3)$-alkyl, $R_3$ is hydrogen or alkyl, especially $(C_1-C_3)$-alkyl, A, B, C and D can be identical or different and are oxa-n- or -iso-alkylene, especially oxa-n- or -iso-$(C_1-C_5)$-alkylene, and l+m+n+o is 3 to 40.

The objects of the invention are further achieved by a recording material producing an ozone-resistant flexographic printing form, consisting essentially of a carrier; and a layer of the photopolymerizable elastomeric mixture.

In addition, the present invention provides a process for producing an ozone-resistant flexographic printing form, comprising the steps of:

a) preparing a photopolymerizable mixture according to the invention by a process selected from the group consisting of extruding the constituents in a single-screw or twin-screw extruder with subsequent final forming in a polishing stack or calender, using a roller head process, and dissolving the constituents in an organic solvent, followed by crosslinking at elevated temperatures and then pressing, b) applying or laminating the layer or solution prepared in a) to a carrier which has optionally been treated to provide an adhesion layer, c) imagewise exposing with actinic light, d) removing the unexposed and uncrosslinked layer areas with a developer solvent, and e) drying the flexographic printing form.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The photopolymerizable elastomeric mixture according to the present invention comprises at least one polyglycol ether of the following general formula I

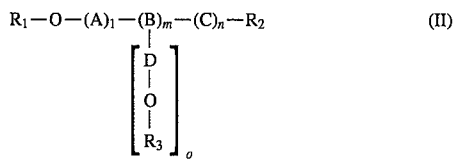

in which $R_1$ and $R_2$ is alkyl, especially $(C_1-C_3)$-alkyl, $R_3$ is hydrogen or alkyl, especially $(C_1-C_3)$-alkyl, A, B, C and D can be identical or different and are oxa-n- or -iso-alkylene, especially oxa-n- or -iso-$(C_1-C_5)$-alkylene and $l+m+n+o$ is 3 to 40.

It is preferred when m and o are greater than 0 and o is less than or equal to m, and $R_3$ is $(C_1-C_3)$-alkyl. It is particularly preferred that both o and m be equal to 1.

If o is not 0, D is preferably identical to A or C, and B is in this case an oxa-n-alkylene radical, especially an oxa-n-$(C_3$ or $C_5)$-alkylene radical. It is particularly preferred, however, when o is 0 and the sum of l, m and n is between 3 and 40.

In a further preferred embodiment, A is identical to C but different from B. In this case, it is preferred that A and C is an oxa-n-$(C_2-C_4)$-alkylene radical and B is an oxa-n- or -iso-$(C_2$ or $C_3)$-alkylene radical. An oxa-isoalkylene radical is especially preferred for B.

It is also preferred when m is 0 in addition to o being 0, and the sum of l and n reaches 3–40. In this case, A and C are oxa-n- or -iso-$(C_1-C_5)$-alkylene, in particular oxa-n- or -iso-$(C_2$ or $C_3)$-alkylene, A or C differing at least in such a way that they are not conjointly an oxa-n-alkylene radical or an oxa-iso-alkylene radical.

Rather, however, that variant is preferred in which l and m, or m and n, are each equal to 0 (o is likewise 0 in this case). In this case, C and A is oxa-n- or -iso-$(C_2-C_5)$-alkylene, especially oxa-n- or -iso-$(C_2$ or $C_3)$-alkylene.

$R_1$ and $R_2$ are in all cases $(C_1-C_3)$-alkyl. In particular, $R_1$ and $R_2$ are identical and particularly preferably are methyl.

The mean molecular weight of the polyglycol ether according to the general formula I is about 100 to 1,400, especially about 200 to 1,200 and particularly preferably about 200 to 600.

The photopolymerizable elastomeric mixture according to the invention contains about 0.1 to 40% by weight, preferably about 0.5 to 20% by weight, of at least one additive according to the general formula I, in each case relative to the elastomeric binder contained in the mixture. The addition of only one compound according to the general formula I is particularly preferred.

Polymers of conjugated aliphatic dienes having 4 to 5 carbon atoms are suitable as the elastomeric binders. Particularly suitable are natural rubbers, homopolymers or copolymers of butadiene and isoprene, copolymers of butadiene and/or isoprene with other monomers such as styrene, vinyltoluene, acrylonitrile or (meth)acrylic acid esters, for example nitrile rubbers, random copolymers of styrene/butadiene, styrene/isoprene and styrene/isoprene/butadiene, or also block copolymers of styrene monomers and butadiene and/or isoprene, having a styrene content of about 10 to 50% by weight. Elastomeric binders of this type are described in DE-A-2,215,040.

The photopolymerizable mixture according to the invention contains in general about 20 to 98% by weight, preferably about 30 to 95% by weight, of at least one of the said elastomeric binder types. It also contains at least one olefinically unsaturated compound polymerizable by free radicals, and at least one photoinitiator.

Suitable monomers having one or more polymerizable olefinic double bonds are especially esters and amides of acrylic and methacrylic acid. Examples are the compatible monoacrylates and diacrylates and monomethacrylates and dimethacrylates of monohydric or polyhydric alcohols such as ethylene glycol, di-, tri-, tetra- or polyethylene glycols, the latter preferably with 10 to 15 ethylene glycol units, 1,3-propanediol, 1,6-hexanediol, dodecanediol, glycerol, 1,1,1-trimethylolpropane, 1,2,4-butanetriol or pentaerythritol, for example ethylene glycol monomethacrylate, 1,3-propanediol monomethacrylate, glycerol monoacrylate and diacrylate, 1,2,4-butanetriol monomethacrylate, hexanediol diacrylate, hexanediol dimethacrylate, dodecanediol diacrylate, 2-ethylhexyl acrylate, lauryl methacrylate, stearyl methacrylate, pentaerythritol triacrylate, polyethylene glycol methyl etheracrylate, tetradecaethylene glycol dimethacrylate or the triether of glycerol and 3 mol of N-methylolacrylamide or N-methylolmethacrylamide. Alkenylphosphonic and alkenylphosphinic acid esters according to German Patent Application P 3,817,424.3 can also be used. The quantity of monomers is in general about 1 to 70% by weight, preferably about 2 to 50% by weight, relative to the non-volatile constituents of the mixture.

The photoinitiators used for the mixture according to the invention can be known compounds which have an adequate thermal stability during the processing of the recording materials and show adequate formation of free radicals during exposure with initiation of the polymerization of the monomers. They should absorb light in the wavelength region from about 250 to about 500 nm with the formation of free radicals. Examples of suitable photoinitiators are acyloins and derivatives thereof, such as benzoin, benzoin alkyl ethers, for example benzoin isopropyl ether, vicinal diketones and derivatives thereof, for example, benzil, benzil acetals such as benzil dimethyl ketal, fluorenones, thioxanthones, polynuclear quinones, acridines and quinoxalines; and also trichloro-methyl-s-triazines, 2-halogenomethyl-4-vinyl-1,3,4-oxadiazole derivatives, halogeno-oxazoles substituted by trichloromethyl groups, carbonylmethylene heterocyclic compounds containing trihalogenomethyl groups according to DE-A 3,333,450, acylphosphine oxide compounds such as are described, for example, in DE-A 3,133, 419, and other phosphorus-containing photoinitiators, for example the 6-acyl-(6H)-dibenzo[c,e][1,2]oxaphosphorine-6-oxides described in German Patent Application P 3,827, 735.2, especially 6-(2,4,6-trimethylbenzoyl)-(6H)-dibenzo [c,e]-[1,2]oxaphosphorine-6-oxide. The photoinitiators can also be used in combination with one another or with coinitiators or activators, for example with Michler's ketone and derivatives thereof or 2-alkyl-anthraquinones. The quantity of photoinitiator is in general about 0.01 to 10% by weight, preferably about 0.5 to 5% by weight, relative to the photopolymerizable mixture.

It is frequently of advantage also to add further auxiliaries and additives to the photopolymerizable mixture, for example, inhibitors of thermal polymerization such as hydroquinone and its derivatives, 2,6-di-tert.-butyl-p-cresol, nitrophenols, nitrosamines such as N-nitrosodiphenylamine or salts of N-nitrosocyclohexyl-hydroxylamine, for example, alkali metal salts or aluminum salts thereof. Further conventional additives are dyes, pigments, plasticizers, antihalation agents, antioxidants, crosslinking agents, regulators, fillers, flow agents and further auxiliaries which improve the function of the layer.

The mixture according to the invention can be used for producing relief and flexographic printing plates by casting from a solution with an organic solvent and by kneading at elevated temperatures and subsequent pressing. Production is also possible by extruding in a single-screw or twin-screw extruder with subsequent final forming by means of a polishing stack or a calender to give layers of a thickness of about 0.1 to 10 mm, preferably from about 0.4 to 6 mm. Production by the roller head process is likewise possible. The layer produced in the way described can be laminated to the surface of a suitable carrier, or a solution of the mixture according to the invention can be applied to a layer carrier.

In addition to the production of relief printing plates, the mixture according to the invention can also be used, for example, for the production of flexographic printing plates, gravure printing cylinders, screen printing stencils and photoresists.

Depending on the intended use, examples of suitable carriers are polyester films, steel sheets or aluminum sheets, copper cylinders, screen printing stencil carriers, plies of foam material, rubber-elastic carriers or printed circuit boards. It can also be advantageous to apply to the light-sensitive recording layer a covering layer or protective layer, for example a thin layer of polyvinyl alcohol, or a covering film which can be peeled off, for example, of a polyethylene terephthalate or polyamide. Moreover, precoating of the carrier can be advantageous. The additional layer between the carrier and the light-sensitive layer can, for example, be effective as an antihalation layer or as an adhesion layer.

The recording material according to the invention can be exposed imagewise with actinic light from light sources such as mercury vapor lamps or fluorescent tubes, the emitted wavelength preferably being between about 300 and 420 nm.

Removal of the unexposed and uncrosslinked layer areas can be effected by spraying, washing or brushing with chlorinated hydrocarbons, esters, aromatic compounds or phenol ethers, such as are described in DE-A-2,215,090 and in German Patent Applications P 3,836,402.6, P 3,836,403.4 and P 3,836,404.2, as yet unpublished. Minor amounts of antifoam or water-miscible organic solvents, for example, lower aliphatic alcohols, can also be added to the solution. Depending on the binder used, development is also possible with water or aqueous solutions.

Expediently, the developed relief forms are dried at temperatures up to about 120° C. and, if appropriate, post-exposed simultaneously or subsequently with actinic light. After drying of the flexographic printing form, the latter can be post-treated with a halogen-containing solution such as, for example, a solution of bromine or chlorine. A post-treatment with actinic light, especially light of a wavelength of less than about 300 nm, is likewise possible. Before the imagewise exposure, the whole area can also be briefly exposed with actinic light from the opposite side.

The recording material according to the invention is particularly suitable for producing printing forms, especially letterpress printing forms or relief printing forms, which are particularly suitable for flexographic printing.

The invention is explained by the examples which follow. In the examples, p.b.w. means parts by weight; unless otherwise stated, g:cm$^3$ is 1:1.

EXAMPLE 1 (COMPARISON EXAMPLE)

A photopolymerizable elastomeric mixture composed of 90 parts by weight of a styrene/isoprene/styrene three-block copolymer having a styrene content of 15% by weight, 8 parts by weight of hexanediol-diacrylate, 2 parts by weight of benzil dimethyl ketal and 0.3 part by weight of 2,6-di-tert.-butyl-4-methylphenol in 100 parts by weight of toluene was prepared.

The mixture was poured out to give a 6 mm thick layer onto a 125 μm thick, biaxially stretched and heat-set polyester film in a metal frame. After evaporation of the toluene, a 125 μm thick, biaxially stretched and heat-set polyester film, provided with an adhesion layer, was applied to the free surface of the now 3 mm thick solid photopolymer layer, and the resulting three-layer element was pressed for 5 minutes under a pressure of 400 N/cm$^2$ at 110° C. in a plate press, using 2.7 mm thick spacers.

After the polyester film which had not been treated with an adhesion promoter had been peeled off, an overcoat of polyamide in a thickness of 3–4 μm was laminated on in its place. First, the whole area of the photopolymer layer was exposed through the remaining polyester film. For this purpose, the multi-layer element was exposed for 10 seconds to the radiation of a commercially available UV-A flat exposure apparatus (spectral region 320–400 nm, radiation intensity on the photopolymer surface: 14 mW/cm$^2$). Imagewise exposure was then carried out with the same radiation source for 30 minutes, but from the opposite side of the multilayer element. Development was carried out with perchloroethylene. After the resulting flexographic printing form had been dried, it was post-treated for 5 minutes with a 0.4% by weight aqueous solution of bromine, followed by rinsing with water for 10 minutes.

The flexographic printing form was then post-exposed for 10 minutes in a commercially available flat exposure apparatus.

The flexographic printing form was then clamped on to a cylinder of 7 cm diameter and subjected to ozone-containing air (0.5 ppm of ozone) in a chamber. The plate was assessed, on the one hand, for the time at which the first cracks appear (cracks visible with the naked eye) and, on the other hand, for the number of cracks which had formed after ozone treatment for 20 hours. The results are summarized in Table 1.

EXAMPLE 2 (COMPARISON EXAMPLE)

A photopolymerizable elastomeric mixture corresponding to Example 1 was prepared, but with an addition of 5 parts by weight of dipropylene glycol monomethyl ether. The elastomeric mixture was, as indicated in Example 1, processed further to give a flexographic printing plate and subjected in the same way to the test in the ozone chamber. The result is comparable with that from Example 1. The additive does not appear to exhibit an effect in the plate. The result can be seen from Table 1.

Example 3

A photopolymerizable elastomeric mixture corresponding to Example 1 was prepared, but with an addition of 10 parts by weight of tetraethylene glycol dimethyl ether. The elastomeric mixture was, as indicated in Example 1, processed further to give a flexographic printing plate and subjected in the same way to the test in the ozone chamber. The results can be seen from Table 1.

EXAMPLE 4

A photopolymerizable elastomeric mixture corresponding to Example 1 was prepared, but with an addition of 5 parts by weight of polyethylene glycol dimethyl ether having a mean molecular weight of 250. The elastomeric mixture was, as indicated in Example 1, processed further to give a flexographic printing plate and subjected in the same way to the test in the ozone chamber. The results are summarized in Table 1.

EXAMPLE 5

In place of polyethylene glycol dimethyl ether of molecular weight 250, 5 parts by weight of polyethylene glycol dimethyl ether of a mean molecular weight of 500 were used in this example. In other respects, the procedure corresponded to that of Example 4. The results are shown in Table 1.

EXAMPLE 6

A photopolymerizable elastomeric mixture composed of 90 parts by weight of a styrene/isoprene/styrene three-block copolymer having a styrene content of 15% by weight, 8 parts by weight of hexanediol diacrylate, 2 parts by weight of benzil dimethyl ketal, 0.3 part by weight of 2,6-di-tert.-butyl-4-methylphenol and 5 parts by weight of polyethylene glycol dimethyl ether (mean molecular weight 250)

was prepared.

The mixture was kneaded in a kneader for 15 minutes at 150° C. The mixture was then applied to a 125 μm thick, biaxially stretched and heat-set polyester film provided with an adhesion layer, and the resulting layer was covered by the same polyester film, but without adhesion layer. The multilayer element produced was pressed for 2 minutes at 110° C. in a plate press, using 2.7 mm thick spacers. After the polyester film not coated with an adhesion promoter had been peeled off, further processing was carried out corresponding to Example 1. The result of this test is likewise demonstrated in Table 1.

Table 1

Treatment of the flexographic printing form with ozone-containing air (0.5 ppm of ozone)

| Example | Start of crack formation | Crack frequency after 20 hours |
|---|---|---|
| 1 | 2 minutes | many |
| 2 | 2 minutes | many |
| 3 | 1 hour | few |
| 4 | 1 hour | few |
| 5 | 3 hours | few |
| 6 | 2 hours | few |

Table 1 demonstrates that the photopolymerizable elastomeric mixture according to the invention with the polyglycol ether according to general formula I produces flexographic printing forms which, in a surprising manner, are substantially more resistant to ozone-containing air than flexographic printing forms which have hitherto been known to those skilled in the art.

What is claimed is:

1. A process for producing an ozone-resistant flexographic printing form, comprising the steps of:

a) preparing a photopolymerizable layer comprising an elastomeric binder; an olefinically unsaturated compound polymerizable by free radicals; and a photoinitiator to form a mixture; wherein the mixture comprises at least one polyglycol ether of the general formula I:

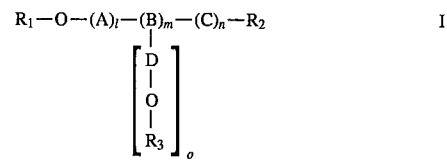

in which $R_1$ and $R_2$ are $(C_{1-3})$alkyl;

$R_3$ is hydrogen or $(C_{1-3})$alkyl

A, B, C, and D can be identical or different and are selected from oxa-n-alkylene or oxa-isoalkylene and wherein l+m+n+o is 3 to 40:

by (1) an extrusion process comprising extruding the mixture in a single screw or twin-screw extruder with subsequent final forming in a polishing stack or calender; or (2) forming a layer out of the mixture using a roller head process or (3) dissolving the mixture in an organic solvent, followed by cross-linking at elevated temperature and then pressing into a layer;

b) applying or laminating the photopolymerizable layer prepared in step a) to a carrier, c) imagewise exposing the photopolymerizable layer with actinic light to produce polymerized and non-polymerized areas, d) removing the unexposed and non-polymerized areas of the photopolymerizable layer with a developer solvent to form a developed flexographic printing form, and e) drying the developed flexographic printing form to form an ozone resistant flexographic printing form.

2. The process as claimed in claim 1, wherein, before the imagewise exposure step c), the photopolymerizable layer is overall exposed through the carrier.

3. The process as claimed in claim 1, wherein, after drying in step (e), the flexographic printing form is post-treated with a halogen solution, or post exposed with actinic light.

4. A process as claimed in claim 1, additionally comprising the step of covering the photopolymerizable layer with a protective layer.

5. A process according to claim 1 wherein the carrier layer has an adhesion layer which is adjacent to the photopolymerizable layer.

* * * * *